United States Patent

Stiles

[15] 3,701,055

[45] Oct. 24, 1972

[54] KA-BAND SOLID-STATE SWITCHING CIRCUIT

[72] Inventor: Charles W. Stiles, Scottsdale, Ariz.

[73] Assignee: Motorola, Inc., Franklin Park, Ill.

[22] Filed: Jan. 26, 1972

[21] Appl. No.: 220,998

[52] U.S. Cl. ....................333/7

[51] Int. Cl. ....................H01p 1/10

[58] Field of Search .........333/7, 13, 34, 95; 307/320

[56] References Cited

UNITED STATES PATENTS

| | | | |
|---|---|---|---|
| 3,418,601 | 12/1968 | Clouser et al. | 333/34 X |
| 3,364,445 | 1/1968 | Broderick | 333/13 |
| 3,179,816 | 4/1965 | Hall et al. | 333/7 |

*Primary Examiner*—Herman Karl Saalbach
*Assistant Examiner*—Marvin Nussbaum
*Attorney*—Foorman L. Mueller et al.

[57] ABSTRACT

A solid-state switching circuit for use in the Ka frequency band is disclosed wherein a body casting which a waveguide passageway therethrough includes one or more packaged PIN diodes in shunt across a reduced height portion of said waveguide. A quarter wavelength bias rod engages the PIN diode package at one terminal and a tuning screw engages the PIN diode package at the other terminal, the tuning screw being turnable into and out of the waveguide.

13 Claims, 6 Drawing Figures

PATENTED OCT 24 1972 3,701,055

KA-BAND SOLID-STATE SWITCHING CIRCUIT

BACKGROUND OF THE INVENTION

This invention relates to a solid-state switching circuit or device to be used in a waveguide for functioning in the Ka frequency band, and it is an object of the invention to provide an improved switching circuit or device of this character.

As the frequencies desired to be used for electrical devices increase, the devices and components become smaller and smaller, and in the case of the Ka-band which comprises the range of 26 -13 40 gigahertz (GHz), the devices become quite small. One form of waveguides for conducting energy in this frequency range such, for example, as the RG96/U waveguide, has interior dimensions of 0.280 inches (width or H plane direction) and 0.140 inches (height or E plane direction).

The problems associated with the design of devices for the Ka-band frequency range, such as switches, are peculiar to this frequency band and the problems associated with designing the same kind of device, for example, a switch for a higher frequency range, for example the V band (50 GHz), will be different than those at the Ka-band, and similarly for devices, such as switches, in the next lower band, Ku-band (18 GHz). In each band, the switches would comprise, at least in part, solid-state elements such as diodes. These, of course, may be packaged or not depending upon all of the factors including frequency and at the frequency bands referred to, the parasitic reactances associated with the solid-state devices become a very important part of the design.

According to the subject invention for the Ka-band, the parasitic reactances of a packaged PIN diode become part of the design of a solid-state switch to enhance its operation and it is a further object of the invention to take full advantage of this fact to provide an improved solid-state switching device or the like for the Ka frequency band.

It is a further object of the invention to provide an improved solid-state switching device, or the like, of the character indicated which can be made at low cost, and as a switch, has an improved insertion loss ratio as between its off and on states over the very wide frequency range of the Ka-band.

It is a further object of the invention to provide an improved switching device, or the like, of the character indicated which is fast in operation, has high-power handling capability, is insensitive to changes in the operating temperature, is lacking in critical mechanical dimensions, and is adjustable in a simple and effective manner.

SUMMARY OF THE INVENTION

In carrying out the invention in one form, there is provided a solid-state switching circuit for use with a waveguide to be functioning in the Ka-band frequency range comprising a waveguide body having a passageway therethrough for conducting wave energy and including a first portion having height and width dimensions corresponding to said frequency range, a second portion having the same width dimension but having a reduced height dimension, and a third portion comprising a ramp extending between said first and second portions; solid-state, two-terminal component means of a certain height and having parasitic series resonant and parasitic parallel resonant states at said Ka-band range in response, respectively, to two conditions of external bias disposed in shunt across said second portion of said waveguide body, the height dimension of said second portion of said waveguide being essentially the same as said certain height of said component means for maximum coupling between the wave energy and said component means; means for providing external DC bias to one terminal of said component; and external means engaging the other one of the terminals of said component for adjusting the impedance presented by said solid-state component to said wave energy.

In carrying out the invention in a second form, there is provided a solid-state switching circuit for use with a waveguide to be functioning in the Ka-band frequency range comprising a waveguide body casting having a passageway therethrough for conducting wave energy and including a first portion having height and width dimensions corresponding to said frequency range, a second portion having the same width dimension but having a reduced height dimension, and a third portion comprising a ramp extending between said first and second portions; a solid-state diode package including a ceramic tube, a first metallic cover bonded to one side of said tube and comprising one terminal, a metallic pedestal disposed on said first cover inside of said ceramic tube, a semiconductor diode having two sides and a junction disposed with one side on said metallic pedestal, a second metallic cover bonded to the other side of said tube and comprising a second terminal, metallic leads connecting the other side of said diode to said second metallic cover, the effective capacitance of the said package being determined by the height of the ceramic tube and the metallic pedestal, the effective inductance of the package being determined by said metallic leads, said semiconductor diode comprising effectively a resistance in parallel with the capacitance of said junction for one parallel circuit, said resistance having two values, a low value at forward bias of said junction and a high value at reverse bias of said junction, said parallel combination of resistance and junction capacitance being in series with the inductance of said leads to define one leg of a second parallel circuit, the other leg of which comprises the said effective capacitance of the package; at the frequency of said Ka-band and in the forward bias condition of said diode, the effective circuit of said package being a parallel resonant circuit comprising the effective capacitance of said package and the inductance of said leads, and at the frequency of said Ka-band and in the reverse bias condition of said diode, the effective circuit of said package being a series resonant circuit comprising the inductance of said leads and the capacitance of said junction; the overall height of said diode package being determined by the combined thickness of said first cover, said ceramic tube and said second cover; means for providing external DC bias to one terminal of the diode in said package; and external screw means in said casting engaging the other one of the terminals of the diode in said package for adjusting the impedance presented by said diode package to said wave energy.

DESCRIPTION OF THE PREFERRED EMBODIMENTS

Figure 1:
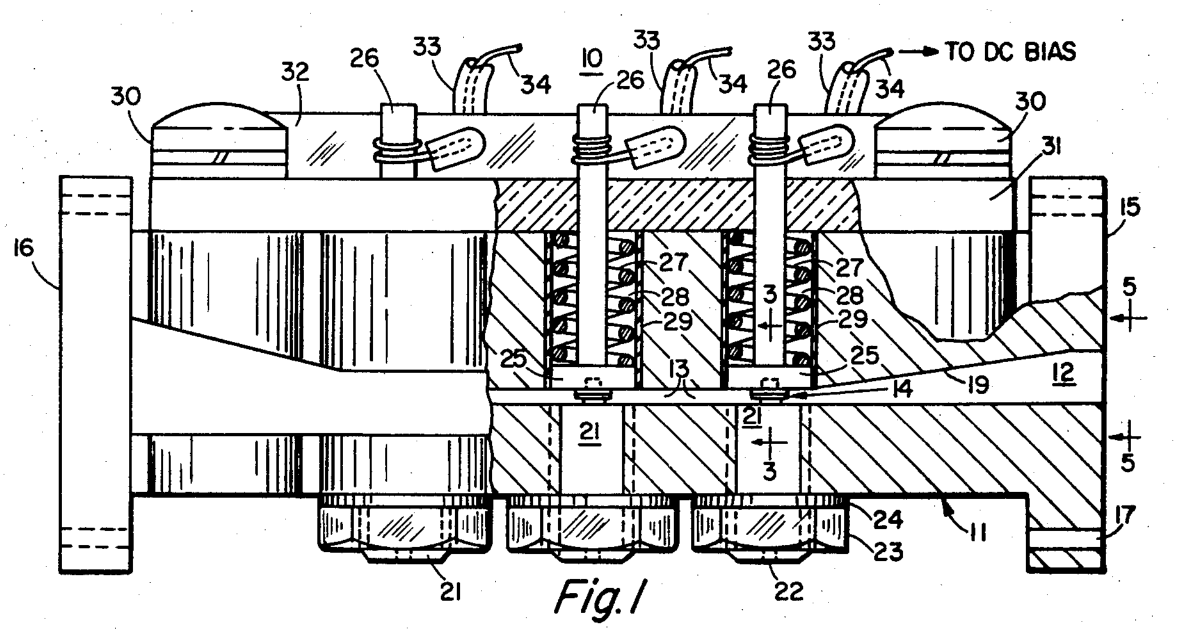
FIG. 1 is an elevational view partially in section, and partially broken away, on an enlarged scale of a solid-state switching device according to the invention.

Referring to the figures there is shown a switching device 10 comprising a body casting 11 having a waveguide passageway 12 therethrough within the center portion 13 thereof, there are mounted three diodes 14.

The diodes 14 are packaged and may be well known PIN switching diodes, as will be described, in order to provide the desired equivalent series and parallel parasitic resonating circuits over the frequencies of the Ka-band. The PIN diode is so designated from the fact that is has a P region and an N region separated by a very thin layer of intrinsic (I) material. While three diodes 14 are shown, it will be understood that less than this number, for example, one, may be used or, for that matter, more may be used if desired for particular conditions, such for example, as three.

The body casting 11 may be cast of aluminum and includes flange portions 15 and 16 at the respective ends for attachment to similarly shaped waveguides as will be understood. Screw holes 17 are provided in the flanges 15 and 16 for attachment to such other waveguides.

The switching device of the invention is intended for use at the Ka frequency band and the waveguide passageway 12 has appropriate dimensions for propagating electromagnetic wave energy at this frequency. Thus the opening 18 in the flanges 15 and 16 will have a width or horizontal dimension (H plane direction) of 0.280 inches and a height or vertical dimension (E plane direction) of one-half that or 0.140 inches. The central portion 13 of the waveguide passageway has the same horizontal dimensions as the aperture 18, but the vertical, or height dimension thereof is tailored to suit the dimensions of the PIN diode, utilized according to the invention, and thus has a value of about 0.032 inches. Extending between the central portion 13 and the aperture 18 is a ramp portion 19 of about one wavelength long. Matching the height of the passageway at 13 to the dimensions of the PIN diode achieves maximum coupling of the wave energy in the passageway to the diodes and enables the device to handle approximately four times the peak power that it would be possible to handle if the passageway portion 13 were of full height.

The packaged diodes 14 are sometimes referred to as micropills and each one thereof, as shown in the figures, is mounted on a threaded screw 21, suitable threaded openings being provided in the body of casting 11 as will be well understood. The screws 21 may be of any variety such, for example, as allenhead screws which include openings 22 in one end for adjustment to the position desired. Thereafter the screws are clamped in position by means of nuts 23 behind which are washers 24. The screws 21 advantageously need not be particularly small and could be, for example, No. 6–32 screws.

On the opposite side of each micropill 14 there is a bias rod or plunger 25 which is held in position by a stem 26 and a spring 27. Suitable cylindrical openings 28 are provided in the casting body 11 and are axially disposed relative to the axes of the respective screws 21. Thus the cylindrical holes 28 are at right angles to the width dimension (H plane) of the waveguide passageway 13. The holes 28 may be formed in any suitable manner either in the casting process or by drilling, for example. Within each of the holes 28 there is a thin walled insulating tube 29 which extends the full length of the opening 28 so as to insulate the bias rod 25, the stem 26 and the spring 27 from the metal of the casting body. The stems 26 may be suitably slideably supported in a plastic member 31 which is attached to the body 11 of the body casting by means of screws 30, for example. Along one edge of the plastic member 31 there is a flange 32 through which insulated conductors 33 are shown extending, the conductors 34 being attached to the metallic stem 26 for conducting DC bias to the diodes as will be described. The springs 27 bearing against the undersurface of the plastic member 31 and against the upper surface of the bias rod 25 hold the bias rod 25 in contact with one terminal of the packaged diodes 14. The insulating tube or sleeve 29 may be a mylar tube, or in the alternative, the bias rod may be coated with Teflon, but in either event the bias rod 25 should be relatively tightly received, but movable, in the opening provided and insulated from the method of the casting.

Figures 2, 3, 4, 5, 6:
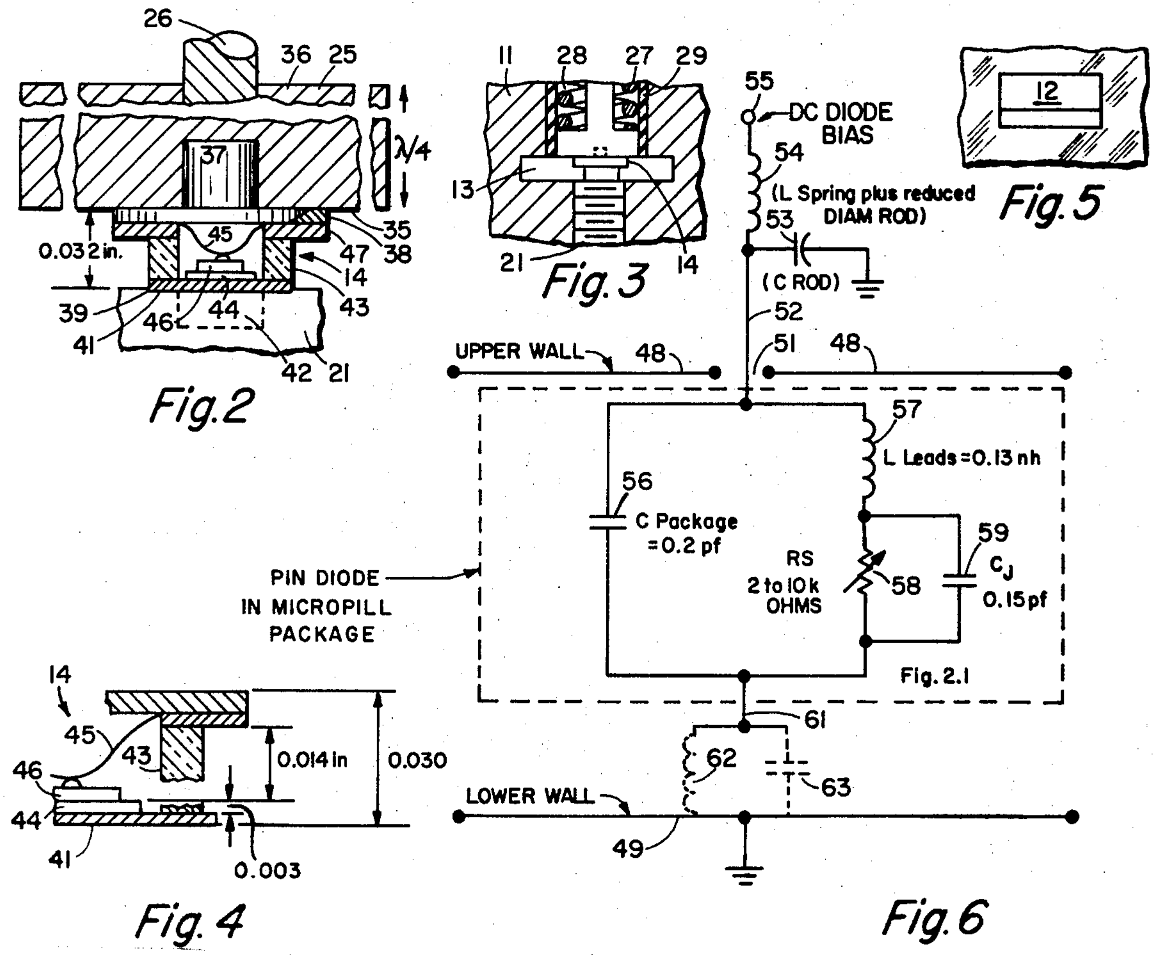
FIG. 2 is a fragmentary sectional view on a larger scale of a portion of the structure shown in FIG. 1.
FIG. 3 is a sectional view on a different scale taken substantially in the direction of the arrows 3—3 of FIG. 1.
FIG. 4 is a fragmentary sectional view of one of the components of the invention.
FIG. 5 is a view taken substantially in the direction of the arrows 5—5 of FIG. 1.
FIG. 6 is an equivalent circuit diagram of the structure according to the invention.

Referring to FIG. 2 it will be seen that the bias rod 25 is one-quarter wavelength long perpendicular to the axis of the waveguide passageway 12. The quarter wavelength dimension of bias rod 25, in the Ka frequency band, causes the lower surface 35 of the bias rod 25 to present a short-circuit at 33 GHz across the top of the waveguide where the surface 35 appears flush with the surface of the waveguide. Accordingly there is no leakage of the wave energy past the bias rod 25. That is to say, the wave energy "sees" the upper surface of the waveguide as a continuous metallic surface.

The rear surface 36 of the bias rod 25 presents an open circuit at the Ka-band because the stem 26 is of very much smaller diameter than the rod 25. Accordingly, DC bias may be brought in through the stem 26 to the diode without any interference with the operation of the device at the high frequency. The stem 26 may be attached to the bias rod 25 in any suitable manner such as by press-fitting or threading or may be made of one piece. The conductors 34 may be attached to the stem 26's by wrapping the conductor therearound and soldering, for example. The coil springs 27 permit the diodes to be moved up and down in the reduced-height waveguide and provide additional series inductance, to further reduce the Ka-band leakage past the bias rod. The micropill 14 includes a prong 37, attached to the lid 38, which projects into an opening in the bias rod 25 for holding the micropill in position.

The bias rod 25 and the stem 26 constitute a coaxial conductor arrangement with the opening 28.

Referring to FIG. 2, the upper end of the screws 21 may include a slight indentation as at 39 to receive the bottom cover 41 of the micropill 14. If desired, the bottom cover 41 may include a prong 42, shown dotted, to be received in a hole in the screw end, for holding the micropill 14 in position against the upper end of screw 21.

The micropill package 14 is selected for use at the Ka-band frequency because of its parasitic self-resonances, which enhance the switching performance as will be explained.

The parasitic self-resonances are, of course, excited by the wave energy traversing the waveguide passageway 12. The package parasitics are determined by the dimensions of ceramic tube 43, the height of the internal metal pedestal 44 and the solid conducting bonding strap 45 extending from the anode of the diode chip 46 to two places on the lid 38.

Referring to FIG. 4, the ceramic tube 43 in the particular case has a height of 0.014 inches above the metal pedestal 44, the pedestal 44 has a height of 0.003 inches and the bonding strap 45 has a cross-section of 0.004 inches by 0.001 inches, the length of the bonding strap 45 being sufficient to connect the anode of the chip 46 to the lid 38. The interior diameter of the ceramic tube 43 does not contribute substantially to the capacitance of the package. The lower edge of the ceramic tube 43 is bonded to the lower lid 41, and the upper end of the tube 43 is bonded to a ring 47 which in turn is bonded to the lid 38. The overall height of the micropill, excluding the prong 37, is approximately 0.030 inches, and the overall height of the ceramic tube member is 0.017 inches. The outside diameter of the ceramic tube 43 is 0.050 inches, and the overall diameter of the lid 38 is 0.082 inches. Comparing FIGS. 2 and 4, it will be seen that the overall micropill height of 0.030 inches $\pm$ 0.002 inches matches the 0.032 inches height of the waveguide passageway. While different dimensions and other micropills may be used, the dimensions given and the particular package characteristics described gave the improved results obtained.

Referring to FIG. 6 there is shown the approximate equivalent electrical circuit corresponding to the mechanical arrangement of the components as shown in the FIGS. including those of the micropill or semiconductor packaged diodes 14. It will be understood by those skilled in the art that there is not necessarily a complete and exact lumped element electrical circuit equivalent to the distributed element electrical circuit as the waveguide including the passageway 12 necessarily is.

The upper wall and lower walls, respectively, of the waveguide central portion 13 are shown in FIG. 6 as conductors 48 and 49, 49 being connected to ground as shown for the lumped element equivalent circuit. The conductor 48 is shown in two parts with a gap 51 therebetween through which conductor 52 passes in order to connect the diodes to the source of DC bias.

As pointed out hereinabove, the gap 51 appearing in the equivalent circuit of FIG. 6 does not exist in actuality inasmuch as the bias rod 25 appears as a short-circuit at this point in the waveguide in order to make the upper wall of the waveguide appear as a continuous metallic surface at the Ka-band. The bias rod 25 appears as a capacitor 53 to ground, whereas the spring 27 and the stem 26 appear as a series inductance 54 connected to the terminal 55 to which the DC diode bias is applied.

The package, which is to say principally the tube 43 and of that, the effective height thereof which is the length of the ceramic tube 43 diminished by the height of the metallic pedestal 44, appears as a capacitor 56 in the electrical circuit diagram and has a value of 0.2 picofarads (pf). The inductance of the bonding strap 45 appears as an inductor 57 in the circuit having a value of 0.13 nanohenries (nh). The PIN diode chip appears as a variable resistance 58 in parallel with a capacitor 59 which corresponds to the capacitance of the junction of the diode and has a value of 0.15 pf. The resistance value 58 of the chip depends upon the bias state. In the forward bias condition, it has a value of about 2 ohms, and in the reverse bias state, it has a value of about 10,000 ohms. The parallel combination of resistor 58 and capacitor 59 is in series with the lead inductance 57.

The parallel combination of capacitor 56 and the leg consisting of inductor 57 and the parallel combination of resistor 58 and capacitor 59 is connected to the conductor 52 and to a conductor 61. An inductance 62 and a capacitance 63 are shown connected to conductor 61 at one end and to the conductor 49 at the other and thus to ground. The inductor 62 and capacitor 63 at the other are shown dotted because they correspond to the condition determined by the location of the adjusting screws 21. When the adjusting screw is turned to intrude into the waveguide, a capacitance is presented in series with the circuit, and when the adjusting screws 21 are turned to extrude from the waveguide, an inductance is presented in series with the circuit. In the PIN diode as described forward bias, typically, consists of 10 milliamperes at one volt DC, the reverse bias condition, typically, is 10 volts DC with very small leakage currents.

In the switching application, the PIN diode has two operating states associated with forward and reverse DC bias of the junction. With forward bias supplied as described, the junction may be represented by a resistance of 2 ohms in parallel with a capacitance of 0.15 pf. At Ka-band frequencies (33 GHz center frequency), the resistance of 2 ohms (58) is small compared to the 32-ohm capacitive reactance (59) and therefore predominates. With reverse bias applied as described, the resistance increases to an open-circuited value of 10,000 ohms and now the reactance of the 0.15 pf capacitance predominates.

With the micropill package chosen for use at Ka-band, a parallel resonance or open-circuit is established across the waveguide when the PIN diode junction is forward biased and presents 2 ohms resistance. In effect, the selected package's parasitic capacitance (0.2 pf) and the bonding lead inductance (0.13 nh) are found to be parallel resonance at 31.2 GHz by use of the formula $$F_{pr}=\frac{1}{2\pi\sqrt{C_{package}L_{leads}}}$$

The open circuit condition produces the least shunting effect by the diode and is known to be the solid-state switching circuit's low-loss mode (typically 1 dB loss per diode). The resonance achieved is very broad, with 1 dB loss maintained from at least 28 to 34 GHz.

A series resonance or short-circuit is established across the waveguide when the PIN diode junction is reverse biased and presents 0.15 pf capacitance. In effect, the package's bonding lead inductance (0.13 nh) and the junction capacitance are found to be in series resonance at 36 GHz by use of the formula $$F_{sr}=\frac{1}{2\pi\sqrt{L_{leads}C_j}}$$

The short-circuit condition produces the greatest shunting effect by the diode and is known to be the switching circuit's high-loss mode (typically 28 dB per diode at the center of resonance). The series resonance achieved is narrower than the parallel resonance, with 20 dB being maintained from 34 to 38 GHz.

To achieve the maximum insertion loss ratio for the two bias states over the frequency range of 30 to 34 GHz, the series resonant short-circuit is lowered in frequency from 36 GHz by withdrawing the tuning screws out of the waveguide a very small amount. The required tuning inductance is than provided in series with the diode. The diode is also partially withdrawn from the waveguide since it sits on top of the screw 21, but no degradation is noted in the high-loss 20 dB band-width. Also, movement of the screw and diode does not effect the very broad band low-loss parallel resonance at 31.2 GHz established in the package itself.

Thus referring to FIG. 6, movement into or out of the waveguide of the PIN diode 14 by the adjusting screw 21 produces the effect of either the inductance or the capacitance 62 and 63, respectively, as may be desired. Accordingly, as pointed out, the adjustment of the circuit to achieve parallel and series resonance at the same center frequency, is very easily accomplished and enables the switch to function in either of its states at the frequency desired in a very inexpensive manner. Thus, there are no critical dimensions in the switching structure as described because the adjusting screw 21 can readily take care of any minor variations in the electrical defects which minor variations of dimensions or diode junction parameters may produce.

Referring again to the equivalent circuit of FIG. 6, the capacitor 53 and the inductor 54 of the bias rod 25 and spring 27 and stem 26 are the equivalents of the rod 25 and the other associated components, and prevent leakage of the high frequency wave energy out of the waveguide.

The micropill package 14, that is, the packaged PIN diode, is in shunt across the waveguide at the central portion 13 and is therefore maximumally coupled to the waveguide inasmuch as the vertical dimensions of the waveguide and the micropill package are essentially the same in this area. As may be noted in FIG. 3, however, the micropill 14 extends over approximately one-third, or so, of the horizontal extent of the waveguide. This, however, does not alter the fact that when the diode is in one or the other of its bias states, a short-circuit or open circuit of the wave energy occurs. An improvement in the attenuation may be achieved by placing more than one micropill 14 along the waveguide passageway at a distance apart of three-quarter wavelength as shown in FIG. 1. If one diode produces, as indicated, about 20 dB of attenuation, two diodes will produce about 46 dB of attenuation, and three diodes will produce about 72 dB of attenuation. The additional attenuation of 6 dB over twice the attenuation of one, for example, comparing 20 with 46 is achieved by the fact that internal reflections of the wave energy take place as between one diode and the one adjacent to it.

The series and parallel resonances described are, of course, parasitically excited by the movement of the waveguide energy along the waveguide and coming into contact with the semiconductive diode. The micropill package's parasitics are the lowest known achievable ones, permitting the broadest series and parallel resonances and range of mechanical frequency tuning to be achieved. After tuning, the solid-state switching circuit with one diode has an insertion loss ratio of 20 dB to 1 dB for the two bias states (10 volts DC reverse and 10 milliamperes forward, respectively) over the frequency range of 30 to 34 GHz. Over a narrower bandwidth (400 MHz) a greater ratio of 24 dB to 1 dB is achievable. With the reverse bias reduced to 0 volts DC, the switching circuit provides 17 dB to 1 dB ratio over the wide band, and 20 dB to 1 dB over the narrow band.

In addition to the improved insertion loss ratio achieved over the wide range of frequencies at the Ka-band, it has been found that the circuit's input and output voltage standing wave ratios are less than 1.5 to 1, the switching speed is less than 10 nanoseconds, and the peak power handling is greater than 150 watts. Moreover, the switch performs as indicated over the temperature range of –54° to 70° C.

What is claimed is:

1. A solid-state switching circuit for use with a waveguide to be functioning in the Ka-band frequency range comprising:

a waveguide body having a passageway therethrough for conducting wave energy, and including a first portion having height and width dimensions corresponding to said frequency range, a second portion having the same width dimension but having a reduced height dimension, and a third portion comprising a ramp extending between said first and second portions;

solid-state, two-terminal component means of a certain height and having series resonant and parallel resonant parasitic states at said Ka-band range in response, respectively, to two conditions of external bias being disposed in shunt across said second portion of said waveguide body, the height dimension of said second portion of said waveguide being essentially the same as said certain height of said component means for maximum coupling between the wave energy and said component means;

means for providing external DC bias to one terminal of said component; and external means engaging the other one of the terminals of said component for adjusting the impedance presented by said solid-state component to said wave energy.

2. The switching circuit according to claim 1 wherein said waveguide body comprises a metallic casting.

3. The switching circuit according to claim 1 wherein said solid-state component means comprises a ceramic packaged semiconductor diode.

4. The switching circuit according to claim 3 wherein said ceramic packaged semiconductor diode comprises a PIN diode.

5. The switching circuit according to claim 1 wherein the external DC bias providing means includes an opening in said waveguide body perpendicular to said width dimension, a one-quarter wavelength coaxial metallic bias rod disposed in said opening, insulated therefrom and engaging one terminal of said solid-state component.

6. The switching circuit according to claim 5 wherein the external means for adjusting the impedance presented by the solid-state component comprises a tuning screw threaded into said body.

7. The switching circuit according to claim 1 wherein said solid-state, two-terminal component means comprises at least one component.

8. The switching circuit according to claim 1 wherein said solid-state, two-terminal component means comprises three components.

9. A solid-state switching circuit for use with a waveguide to be functioning in the Ka-band frequency range comprising:

a waveguide body casting having a passageway therethrough for conducting wave energy and including a first portion having height and width dimensions corresponding to said frequency range, a second portion having the same width dimension but having a reduced height dimension, and a third portion comprising a ramp extending between said first and second portions;

a solid-state diode package including a ceramic tube, a first metallic cover bonded to one side of said tube and comprising one terminal, a metallic pedestal disposed on said first cover inside of said ceramic tube, a semiconductor diode having two sides and a junction disposed with one side on said metallic pedestal, a second metallic cover bonded to the other side of said tube and comprising a second terminal, metallic leads connecting the other side of said diode to said second metallic cover, the effective capacitance of the said package being determined by the height of the ceramic tube and the metallic pedestal, the effective inductance of the package being determined by said metallic leads, said semiconductor diode comprising effectively a resistance in parallel with the capacitance of said junction, said resistance having two values, a low value at forward bias of said junction and a high value at reverse bias of said junction, said parallel combination of resistance and junction capacitance being in series with the inductance of said leads to define one leg of a second parallel circuit, the other leg of which comprises the said effective capacitance of the package; at the frequency of said Ka-band and in the forward bias condition of said diode, the effective circuit of said package being a parallel resonant circuit comprising the effective capacitance of said package and the inductance of said leads, and at the frequency of said Ka-band and in the reverse bias condition of said diode, the effective circuit of said package being a series resonant circuit comprising the inductance of said leads and the capacitance of said junction;

the overall height of said diode package being determined by the combining thickness of said first cover, said ceramic tube and said second cover;

means for providing external DC bias to one terminal of the diode in said package; and external means engaging the other one of the terminals of the diode in said package for adjusting the impedance presented by said diode package to said wave energy.

10. The switching circuit according to claim 9 wherein the external DC bias providing means includes an opening in said waveguide body perpendicular to said width dimension, a one-quarter wavelength coaxial metallic bias rod disposed in said opening, insulated therefrom and engaging one terminal of said solid-state component.

11. The switching circuit according to claim 10 wherein the external means for adjusting the impedance presented by the solid-state component comprises a tuning screw threaded into said body.

12. The switching circuit according to claim 10 wherein more than one solid-state diode package is disposed in said waveguide, said packaged diodes being spaced apart by three-quarters of a wavelength.

13. The invention according to claim 10 wherein said DC bias rod includes a metallic stem of reduced diameter for holding the bias rod and a spring surrounding said stem for urging said bias rod against said diode package.

* * * * *